(12) United States Patent
Bjørnerud et al.

(10) Patent No.: US 6,901,281 B2
(45) Date of Patent: May 31, 2005

(54) METHOD OF MAGNETIC RESONANCE IMAGING

(75) Inventors: Atle Bjørnerud, Oslo (NO); Kenneth Edmund Kellar, Flemington, NJ (US); Karen Briley-Saebo, Oslo (NO); Lars Johansson, Uppsala (SE)

(73) Assignee: Amersham Health AS, Oslo (NO)

( * ) Notice: Subject to any disclaimer, the term of this patent is extended or adjusted under 35 U.S.C. 154(b) by 471 days.

(21) Appl. No.: 09/815,140

(22) Filed: Mar. 22, 2001

(65) Prior Publication Data

US 2001/0041833 A1 Nov. 15, 2001

Related U.S. Application Data

(63) Continuation of application No. PCT/GB99/03134, filed on Sep. 21, 1999.
(60) Provisional application No. 60/106,695, filed on Nov. 2, 1998.

(30) Foreign Application Priority Data

Sep. 28, 1998 (GB) .............................. 9821038

(51) Int. Cl.⁷ ................................ A61B 5/05
(52) U.S. Cl. .................... 600/420; 600/407; 600/410; 600/430; 600/300; 600/310; 600/311; 600/323; 424/9.3; 382/128; 382/130; 324/300; 324/307; 324/312
(58) Field of Search ................................ 600/300, 310, 600/311, 323, 410, 407, 420, 430; 324/300, 312, 307; 382/128, 130; 424/9.3

(56) References Cited

U.S. PATENT DOCUMENTS

| 5,233,991 | A | | 8/1993 | Wright |
| 5,464,696 | A | * | 11/1995 | Tournier et al. ............ 428/403 |
| 5,494,030 | A | * | 2/1996 | Swartz et al. ............... 600/323 |
| 5,508,021 | A | | 4/1996 | Grinstaff et al. |
| 5,545,395 | A | * | 8/1996 | Tournier et al. ........... 424/9.32 |
| 5,587,199 | A | * | 12/1996 | Tournier et al. ........... 427/2.12 |
| 5,694,934 | A | * | 12/1997 | Edelman ..................... 600/410 |
| 5,792,056 | A | | 8/1998 | Prince |
| 5,846,200 | A | * | 12/1998 | Schwartz ..................... 600/443 |
| 6,042,809 | A | * | 3/2000 | Tournier et al. ............. 424/9.3 |
| 6,256,527 | B1 | * | 7/2001 | Leunbach et al. .......... 600/420 |
| 6,370,415 | B1 | * | 4/2002 | Weiler et al. ............... 600/410 |
| 6,488,910 | B2 | * | 12/2002 | Driehuys .................... 424/9.3 |
| 6,595,211 | B2 | * | 7/2003 | Weiler et al. .......... 128/204.18 |

FOREIGN PATENT DOCUMENTS

WO   WO 97/25073   7/1997

OTHER PUBLICATIONS

Kennan, R. P., et al. "Physiologic Basis for BOLD MR Signal Changes Due to Hypoxia/Hyperoxia: Separation of Blood Volume and Magnetic Susceptibility Effects" Magentic Resonance in Medicine, Jun. 1997, Williams & Wilkins, USA, vol. 37, No. 6, pp. 953–956.

Wang, Y., et al. "Differentiating Arteries and Veins Using Phase in Contrast Enhanced MRA" Proceedings of the International Society For Magentic Resonance in Medicine, Sixth Scientific Meeting and Exhibition, Sydney, Australia, Apr. 18–24, 1998, vol. 2, p. 771.

(Continued)

*Primary Examiner*—Brian L. Casler
*Assistant Examiner*—William C. Jung
(74) *Attorney, Agent, or Firm*—Robert F. Chisholm

(57) ABSTRACT

The invention provides a method of magnetic resonance imaging of regional blood oxygenation which comprises administering into the vasculature of a vascularized human or non-human animal subject a $T_2$ blood pool contrast agent, detecting a magnetic resonance signal from at least part of the vasculature of said subject into which said contrast agent distributes, and manipulating said signal to generate an indication of the partial pressure of oxygen ($pO_2$) in at least part of said vasculature.

7 Claims, 11 Drawing Sheets

OTHER PUBLICATIONS

Nolte–Ernsting, C., et al. "Experimentelle Erprobung Superparamagnetischer Eisenoxidnanopartikel für die MR–Pulmonalisangiographie" Röfo, Fortschritte Auf Dem Gebiet Der Röntgenstralen Und Der Bildgebenden Verfahren, vol. 168, p. 5, May 1988, pp. 508–513.

Wilkström, J., et al. "Abdominal Vessel Enhancement with the Blood Pool Agent NC100150: Realtion to Dose and Echo Time" Proceedings of the International Society for Magnetic Resonance in Medicine, Sixth Scientific Meeting and Exhibition, Sydney, Australia, Apr. 18–24, 1998, vol. 2, p. 1046.

Hoppel, B. E., et al. "Measurement of Regional Blood Oxygenation and Cerebral Hemodynamics" Magnetic Resonance in Medicine, US, Academic Press, Duluth, MN, colume 30, No. 6, p. 715–723.

Bjørnerud, A., et al. "Use of Intravascular Contrast Agents in MRI" Academic Radiology, vol. 5 (suppl 1), Apr. 1998, pp. 223–225.

Fossheim, S., et al. "Low Molecular Weight Lanthanide Contrast Agents: In Vitro Studies of Mechanisms of Action" Journal of Magnetic Resonance Imaging (JMRI), vol. 7, 1997, pp. 251–257.

Rabi, I. I. "On the Principal Magnetic Susceptibilities of Crystals" Physical Review, vol. 29, Jan. 1927, pp. 174–185.

Fabry, M. E., et al. "Effect of Magnetic Suceptibility on Nuclear Magnetic Resonance Signals Arising from Red Cells: A Warning" Biochemistry, 1983, vol. 22, pp. 4119–4125.

Stoll, M. E., et al. "Reduction of Magnetic Susceptibility Broadening in NMR by Susceptibility Matching" Journal of Magnetic Resonance, 1982, vol. 46, pp. 283–288.

Liebig, T., et al. "A Potentially Artifact–Free Oral Contrast Agent for Gastrointestinal MRI" Magnetic Resonance Medicine, 1993, vol. 30, pp. 646–649.

Briggs, R., et al. "In Vivo Animal Tests of an Artifact–Free Contrast Agent for Gastrointestinal MRI" Magnetic Resonance Imaging, 1997, vol. 15, pp. 559–566.

* cited by examiner

METHOD OF MAGNETIC RESONANCE IMAGING

This application claims the benefit of Provisional Application No. 60/106,695, filed Nov. 2, 1998.

This is a continuation of International Application PCT/GB99/03134, with an international filing date of Sep. 21, 1999.

This invention relates to improvements in and relating to methods of magnetic resonance imaging, in particular imaging of blood oxygenation levels, and to the use of magnetic materials for the manufacture of contrast media for use in methods of diagnosis involving such methods of imaging.

In magnetic resonance angiography, magnetic resonance (MR) imaging of the vascular tree, it is a problem to distinguish arteries from veins. Conventional MR contrast agents with a prolonged blood half life, ie. which remain in the circulating blood for a prolonged period, will generally give equal enhancement of veins and arteries. Consequently, in the resultant MR images, arteries cannot be distinguished from veins.

The present invention relies on the use of a contrast agent which has a water proton $T_2$ and $T_1$ reducing effect and which is retained in the blood plasma, i.e. which neither distributes significantly into the interstitium nor crosses cell membranes. With such contrast agents, hereinafter referred to as "$T_2$ blood pool agents", present in the blood there are two different contributions to $T_2$ reduction for water protons in blood—reduction due to diffusion past the contrast agent in the blood and reduction due to diffusion through the magnetic field gradients due to the differences in magnetisation between the interior and exterior of the red blood cells. The second of these contributions is dependent on the oxygenation state of the haemoglobin in the red blood cells. In the veins the haemoglobin is deoxygenated and as a result the red blood cells are paramagnetic while in the arteries the haemoglobin is oxygenated and the red blood cells are diamagnetic. Thus the differences in magnetisation between the interior of the red blood cells and the exterior contrast agent containing plasma are different in the veins than in the arteries and $T_2^*$ will accordingly be different. Since the magnetisation difference contributes only to a $T_2$ reduction and not a $T_1$ reduction, the MR signal intensity from the veins will be different from that from the arteries.

A further effect also facilitates differential enhancement of the venous signal relative to the arterial signal. Thus since blood flow is generally slower and less pulsatile in veins, there is less signal loss due to intravoxel dephasing in veins than in arteries.

While the contrast agent is referred to as a $T_2$ blood pool contrast agent, this is not intended to indicate that the $T_2$ reducing effect of the contrast agent dominates over its $T_1$ reducing effect in terms of its overall effect on MR signal intensity. Thus the $T_1$ reducing effect may indeed dominate in veins and even in arteries with the result being an increase in MR signal strength. In other words the $T_2$ blood pool contrast agent may nonetheless function as a "positive" contrast agent, that is to say one which increases MR signal strength in the regions into which it distributes.

Thus viewed from one aspect the present invention provides a method of magnetic resonance imaging of regional blood oxygenation which comprises: administering into the vasculature of a vascularised human or non-human animal (e.g. a mammal, reptile or bird) subject a $T_2$ blood pool contrast agent; preferably waiting until the contrast agent is uniformly distributed in the subject's blood pool; detecting a magnetic resonance signal from at least part of the vasculature of said subject into which said contrast agent distributes; and manipulating said signal to generate an indication of the partial pressure of oxygen (p$O_2$) (e.g. an image indicative of p$O_2$) in at least part of said vasculature, e.g. to differentiate between veins and arteries or to identify a region of ischemia.

As the concentration of the $T_2$ contrast agent in the blood increases, R2* (i.e. 1/$T_2^*$) of deoxygenated blood first decreases as the contrast agent reduces the susceptibility effect of the paramagnetic red blood cells and then increases as it causes the magnetisation in the plasma to exceed that within the red blood cells. In oxygenated (arterial) blood however, R2* generally increases as $T_2$ contrast agent concentration increases. Since, in the absence of the contrast agent, R2* of deoxygenated blood is greater than that of oxygenated blood, there is a concentration range over which R2* is substantially the same in both oxygenated and deoxygenated blood, i.e. a range of "matched susceptibility".

Thus both below and above the matched susceptibility concentration range, MR signal strengths from oxygenated and deoxygenated blood will differ and veins and arteries may be distinguished from each other in MR images. Below the matched susceptibility concentration range, oxygenated blood will show up brighter than the deoxygenated blood in the MR images. Above the matched susceptibility range, oxygenated blood will show up darker in the MR images than the deoxygenated blood.

In the method of the invention the $T_2$ contrast agent is preferably administered in a dose which, when distributed evenly in the blood pool (e.g. after a period of 10 to 100 minutes post administration, preferably 15 to 30 minutes) at a concentration in the blood which is greater than the concentration at which the difference in R2* of the oxygenated (arterial) and deoxygenated (venous) blood is minimum (i.e. above the matched susceptibility range), e.g. a whole blood concentration of above 0.4 mM Fe for superparamagnetic iron oxide (SPIO) contrast agents, preferably above 0.5 mMFe, more preferably 0.5 to 2 mM Fe. For humans, this corresponds to a contrast agent dosage of 1 to 8 mg Fe/kg bodyweight.

For sub-matched susceptibility concentrations, e.g. 0.05 to 0.5 mM Fe (or more preferably 0.05 to 0.3 mM Fe) for SPIO contrast agents or 0.2–10 mM Gd (e.g. 0.8 to 4 mM Gd) for gadolinium chelate blood pool contrast agents (using clinically used magnetic field strengths of 1 to 1.5T for example) it is still feasible to differentiate veins from arteries and to improve the assessment of the difference between R2* in veins and arteries.

At sub-matched susceptibility concentrations, it is possible to use the inherent difference in dipolar transverse relaxation times ($T_2$) between arteries and veins to differentiate arterial from venous structures. The dose of the conrast agent in this embodiment of the invention should desirably be low enough not to significantly alter $T_2$ of blood but high enough to significantly shorten $T_1$ of blood relative to baseline. In this way, by using MR acquisition sequences which are sensitive to relatively small $T_2$ differences and also sensitive to short $T_1$ values, it is possible to obtain images with bright vessels in general, with the arteries (with longer $T_2$) brighter than the veins. Particularly suitably a non-spoiled gradient echo sequence with a relatively short TR (e.g. TR is less than $T_2$ of blood) is used. Spoiling (removal of transverse magnetization prior to each new excitation) is normally applied in MR angiography to optimize $T_1$ sensitivity. However by not spoiling, the available magnetization (Mz) and hence signal intensity, is modulated by the inherent $T_2$ of the blood. A longer $T_2$ will increase Mxy (magnetization in the x-y plane) and hence signal intensity since $T_2$ of oxygenated blood is longer than $T_2$ of deoxygenated blood. Consequently oxygenated blood will show up brighter in the MR images than deoxygenated blood. A "driven equilibrium" type of sequence can be applied where the remnant transverse magnetization is brought back into the direction of the main magnetic field (Mz) prior to each new excitation pulse. Moreover it is possible to subtract image data sets for a spoiled and a non-spoiled sequence. In the spoiled image, arteries and veins will have essentially equal signal intensity (since there is no $T_2$ sensitivity) while in the non-spoiled image, arteries will appear brighter than veins. Subtracting the two will enhance the ability to differentiate arteries from veins. For this technique, a paramagnetic rather than superparamagnetic contrast agent is preferred.

As mentioned above, increasing $T_2$ contrast agent concentration results in increasing R2* in oxygenated blood. The increase is dependent on contrast agent concentration, oxygenation (i.e. $pO_2$) and hematocrit (i.e. the percentage volume of whole blood which is red blood cell).

Hematocrit may be determined by taking a blood sample. Alternatively however since, for oxygenated arterial blood, oxygenation may be assumed to be about 97% and determination of R2* and $R_1$ (i.e. $1/T_1$, which is dependent on contrast agent concentration) for arterial blood enables hematocrit to be determined and determination of R2* for venous blood enables the oxygenation level of the venous blood to be determined and the oxygen uptake of specific organs to be estimated.

Viewed from another aspect the invention provides a method of magnetic resonance imaging of regional blood oxygenation which comprises administering into the vasculature of a vascularised human or non-human animal subject a $T_2$ blood pool contrast agent, detecting a magnetic resonance signal from at least part of the vasculature of said subject into which said contrast agent distributes, and manipulating said signal to provide differential enhancement of arteries and veins.

Since the magnetisation of the blood plasma, following administration of the $T_2$ contrast agent into the vasculature, is dependent on the local concentration and the magnetisation of the contrast agent, the difference in MR signal intensity between arteries and veins or between normal and ischemic tissue will be dose-dependent and also, in echo imaging techniques, echo time (TE) dependent. Thus, in one preferred embodiment of the invention, MR signal detection and manipulation will involve generation of (at least) two MR images, one more $T_2$ dependent than the other, and comparison of the images whereby to selectively visualise regions of lower or higher blood oxygenation. Such comparison may for example involve subtraction of one image from the other, optionally after normalisation of one or both images to enhance the selective visualisation, e.g. by setting the image intensity for a selected region of interest to the same value in both images.

The relatively more and less $T_2$ dependent images may be generated by conventional MR imaging sequences, e.g. from echo sequences involving shorter or longer echo times generated sequentially or alternatingly (i.e. interleaved sequences). In a particularly preferred embodiment however a double echo sequence may be used with the two images being generated from earlier and later echos. Thus a double echo sequence may advantageously be used—the first (short TE) echo will give almost equal signal intensity for veins and arteries (or normal and ischemic tissue) while the second (long TE) echo will have higher signal intensity for veins than for arteries, etc. Subtracting the first image from the second will selectively visualise arteries or veins. Furthermore by evaluating the relative degree of oxygenation (i.e. $pO_2$) of the blood flowing to and from a tissue or organ, the oxygen consumption of that tissue or organ can be evaluated. The blood $pO_2$ can be determined in a quantitative, semi-quantitative or qualitative manner, for example by comparison with calibration values determined for known $pO_2$ and contrast agent concentration values.

Thus viewed from a further aspect the invention provides method of magnetic resonance imaging of a human or non-human animal subject which comprises administering into the vasculature of said subject a $T_2$ blood pool contrast agent, generating at least two images of at least part of said subject, a first of said images being more $T_2$-dependent than a second of said images, and comparing said first and second images (e.g. by subtraction of one from the other) whereby to obtain an image providing an indication of regional blood oxygenation in said subject.

In the methods of the invention the optimal echo time needed to maximise the signal intensity between oxygenated and deoxygenated blood can be calculated for a given difference in R2. Given that the signal intensity (SI) is proportional to $\exp(-R2^*TE)$, the relative difference in SI between blood with different R2 is given by:

$$\text{delta } SI = A^*(\exp(-R2_1^*TE) - \exp(-R2_2^*TE))$$

where A is a constant and $R2_1$ and $R2_2$ are the relaxation rates of arterial and venous blood respectively.

Taking the partial derivative with respect to TE one obtains:

$$TE_{opt} = \ln(R2_1/R2_2)/(R2_1 - R2_2)$$

where $TE_{opt}$ is the optimal TE for maximum SI difference between blood with relaxation rate of $R2_1$ and $R2_2$ respectively.

As an example, using typical R2 values in oxygenated and deoxygenated blood respectively, one gets: $R2_1 = 230$ s$^{-1}$ and $R2_2 = 130$ s$^{-1}$ giving $$TE_{opt} = \ln(230/130)/(230-130) = 5.7 \text{ ms}.$$

It is seen from the above that the optimal TE for maximum SI difference beween arteries and veins depends on the absolute value of the relaxation rates as well as the relative difference in R2 between arteries and veins.

In the methods of the invention, the contrast agent dosage will preferably be such as to substantially cancel out the magnetisation difference between plasma and deoxygenated (venous) blood. The appropriate dosage will thus depend on the blood pool volume of the subject, the red blood cell count of the subject, the magnetic susceptibility of the contrast agent and the field strength of the magnet in the MR imaging apparatus. The first of these can readily be estimated to a sufficient level of accuracy, the second can be measured or estimated, the third can readily be measured and the fourth is known for each apparatus.

It is known that the susceptibility difference $\Delta\chi$ between red blood cells and plasma in venous blood with about 40% hematocrit is about $8 \times 10^{-8}$ cgs/cm$^3$. At a magnetic field strength of 1.5T this corresponds to a magnetisation difference $\Delta M$ of 1.2 A/m. The magnetisation at 1.5T of the PEGylated superparamagnetic particulate contrast agent described in WO97/25073 is 4.5 A/m/mMFe and as a result a dose of that agent which provides a plasma concentration of 0.26 mMFe will reduce $\Delta M$ to about zero and minimise R2 in the venous blood. Provided that the blood iron concentration is equal to or higher than the concentration which minimises R2* ($1/T_2^*$) relaxation rate of venous blood, the blood in the veins will have a greater $T_2$ value than that in the arteries and will thus give a different MR signal intensity. The optimal blood iron concentration for distinguishing between venous and arterial blood will depend on the actual $T_2$ and $T_1$ values of such blood and on the MR imaging sequences used.

Generally speaking for subjects of a given species, the R2* values for oxygenated and deoxygenated blood may be measured at the field strength of the primary magnet of the MR imager to be used and a blood contrast agent concentration should be used at which the two R2* values are sufficiently different that a difference in signal intensity between venous and arterial blood may be observed (cf. Examples 3 and 4 below and FIGS. 2 and 3).

Approximating the blood pool volume as 80 mL/kg bodyweight for mammals such as humans this corresponds to a dosage of about 1 mg Fe/kg. Thus for human subjects the contrast agent dosage will preferably be in the range 0.2 to 8 mgFe/kg bodyweight, more preferably 0.5 to 6 mg/kg, still more preferably 1 to 5 mg/kg.

Thus viewed from a further aspect the invention provides a method of magnetic resonance imaging of a mammalian, preferably human, subject which comprises administering a $T_2$ blood pool superparamagnetic iron oxide contrast agent into the vasculature of said subject and generating a $T_2$-dependent (e.g. $T_2$ weighted) magnetic resonance imaging of at least part of said subject, the improvement comprising administering said contrast agent at a dosage in the range 0.2 to 8 mgFe/kg bodyweight, preferably 1 to 5 mg/kg, etc.

The methods of imaging of the invention may optionally be defined as involving only the steps subsequent to the administration of the contrast agent. Besides distinguishing between venous and arterial blood or between normal and ischemic tissue, the methods of the invention will allow lung function to be studied. Likewise the methods may be used to study kidney structure and function and tumor structure and development. Images where the contrast agent provides contrast enhancement of blood vessels may be used to detect the regions of the lung with abnormal blood supply; however the $T_2$ enhancement of the signals from deoxygenated blood may also be used to detect regions within the lung where oxygen uptake is abnormal, e.g. as a result of tumors or airway obstructions.

Thus viewed from a further aspect the invention provides a method of magnetic resonance imaging of lung function in a human or non-human subject, said method comprising administering into the vasculature of said subject a $T_2$ blood pool contrast agent, generating a $T_2$-dependent magnetic resonance image of at least part of the lungs of said subject and identifying regions of abnormal MR signal intensity within the lungs.

The $T_2$ blood pool contrast agent used in the methods of the invention may be any physiologically tolerable paramagnetic, superparamagnetic, ferromagnetic or ferrimagnetic material which may selectively increase magnetisation of blood plasma without substantially influencing the $pO_2$ within the red blood cells. Conveniently the material will be one which has a blood half life (measured for example in the pig) of at least 15 minutes, preferably at least 30 minutes, more preferably at least 1 hour. Generally the contrast agent will be a water-soluble or water-dispersible material, e.g. a polychelate (preferably a dendrimeric polychelate) of a transition metal or lanthanide or it will be a particulate material, e.g. having a particle size of 1 to 8000 nm, preferably 5 to 500 nm, especially preferably a particulate material having on or as its surface a blood residence prolonging agent, for example a polyalkylene oxide (e.g. polyethyleneglycol) or a glycosaminoglycan (e.g. heparin, dermatan, hyaluronic acid, keratan, chondroitin, etc.). Particulate agents may be solids (e.g. single substances or aggregates containing a matrix material and a magnetic material) or they may even be droplets of water-insoluble liquid materials. Particulate agents will generally be preferred to water soluble agents. SPIOs having a $r_2/r_1$ ratio of less than 2.3, particularly less than 2.0, are especially preferred.

The magnetic property of the contrast agent which is of particular concern is its magnetic susceptibility. Accordingly where the contrast agent is paramagnetic it is preferred that the paramagnetic centres be high susceptibility lanthanide metal ions which possess high $T_1$ relaxivity, such as for example Gd or Eu. Examples of gadolinium-based agents include gadolinium metallated polychelants, e.g. polylysine poly GdDTPA and cascade polymer or dendrimer based gadolinium polychelates. The magnetic susceptibility of superparamagnetic materials is markedly higher than that of paramagnetic materials and it is especially preferred that the $T_2$ contrast agent be or contain a superparamagnetic material, e.g. an iron oxide or mixed iron oxide, for example magnetite. Superparamagnetic contrast agents are also preferred since they are generally fully magnetised at the field strengths used in chemical imaging. By contrast, the magnetisation induced by a chelate-based contrast agent is field dependent.

Many susceptibility agents have been described in the patent literature by companies such as Nycomed, Schering, Advanced Magnetics, Silica Gel, BASF, Sterling Winthrop, MBI, The General Hospital Corp, Meito Sangyo, etc. An exemplary $T_2$ blood pool agent is the PEGylated superparamagnetic material disclosed by Nycomed Imaging AS in WO97/25073.

Thus viewed from a further aspect the invention provides use of a physiologically tolerable paramagnetic, ferrimagnetic, ferromagnetic or more preferably superparamagnetic material for the manufacture of a contrast medium for use in a method of diagnosis which involves a method of imaging according to the invention.

While the methods of the invention will normally involve generating an image of at least a vascularised part of the subject's body in which arteries and veins are interdistinguisable by virtue of signal intensity (e.g. pixel colour or shade), this need not be the case. Regions of interest comprising arteries and/or veins may be selected, for example from pre-contrast images, and R2* and/or $R_1$ values for such regions determined post-contrast and manipulated to produce graphs or simple numerical values indicative of $pO_2$ or oxygen consumption by an organ to which or from which such vessels lead. Likewise $pO_2$ (or oxygen consumption) may be determined in a quantitative or semi-quantitative way, for example in absolute pressure (or volume) values or as percentages of attainable oxygenation levels, etc. Thus in one preferred embodiment, images may be generated in which pixel color or shade within visualised vasculature is directly dependent on $pO_2$ or % oxygenation. In this way for example lung function may be visualised by such selective coloring or shading of the veins leading back from the lung to the heart. In an alternative embodiment R2* values may be used to characterise visualisable vasculature as simply containing oxygenated or deoxygenated blood with one color or shade value being assigned to oxygenated and another to deoxygenated.

The invention will now be described further with reference to the following non-limiting Examples and the accompanying drawings in which.

Figure 5:
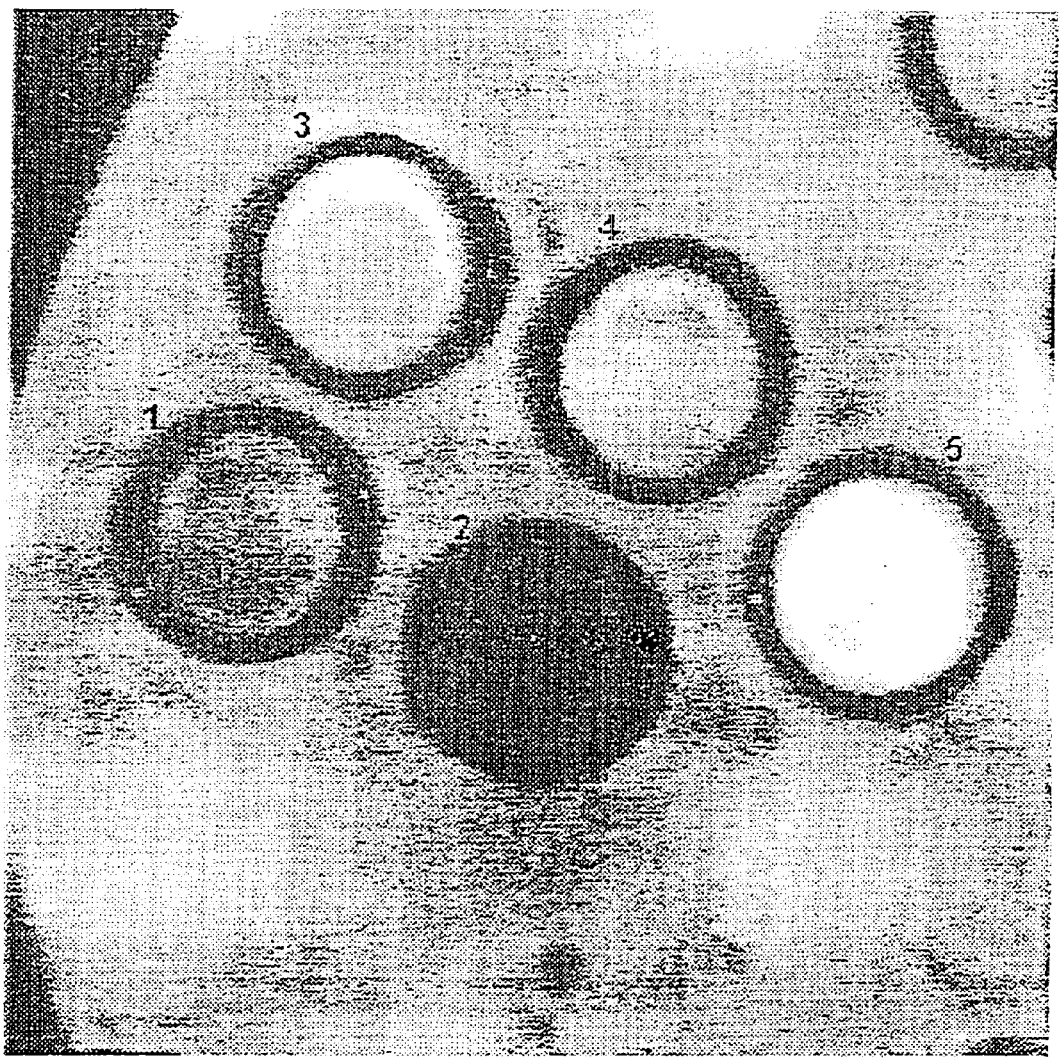
Figure 6:
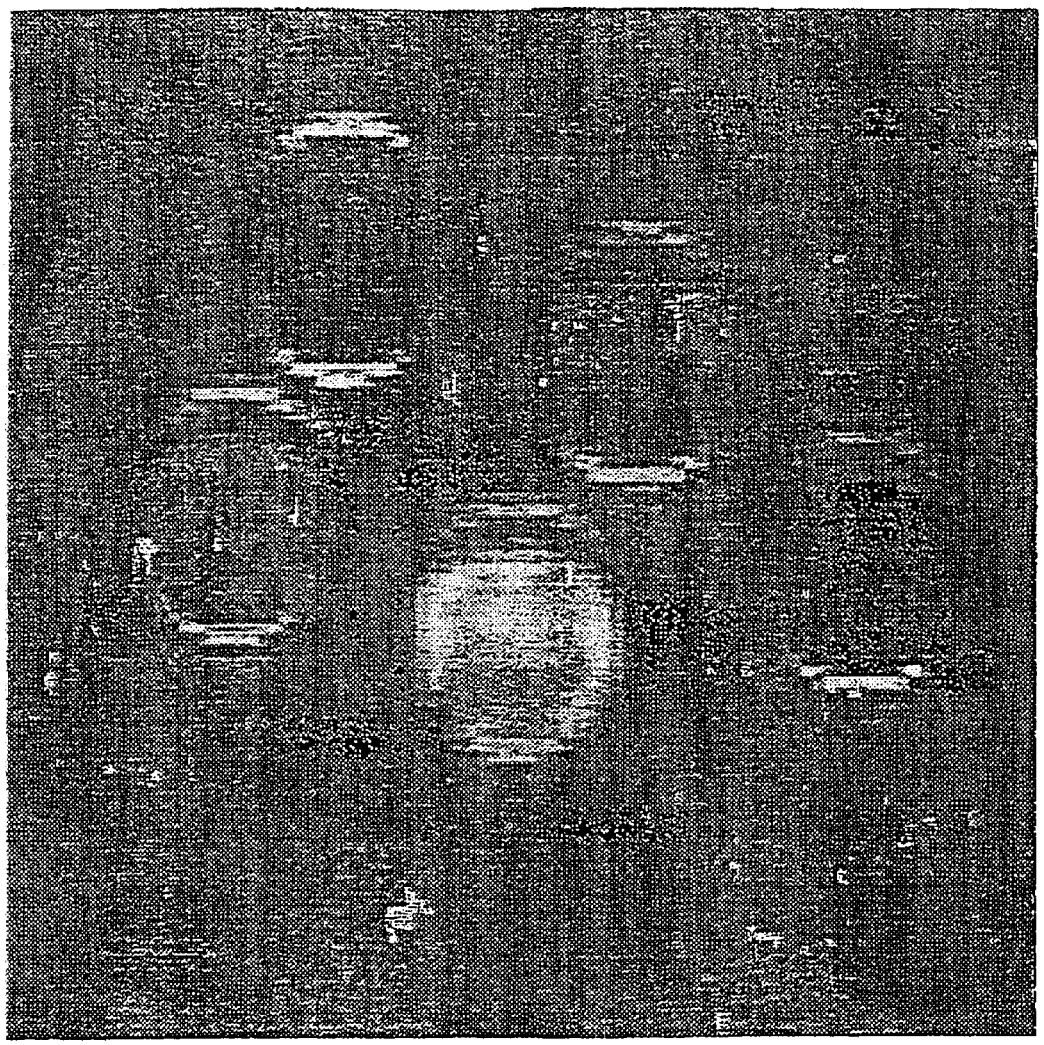
Figure 7:
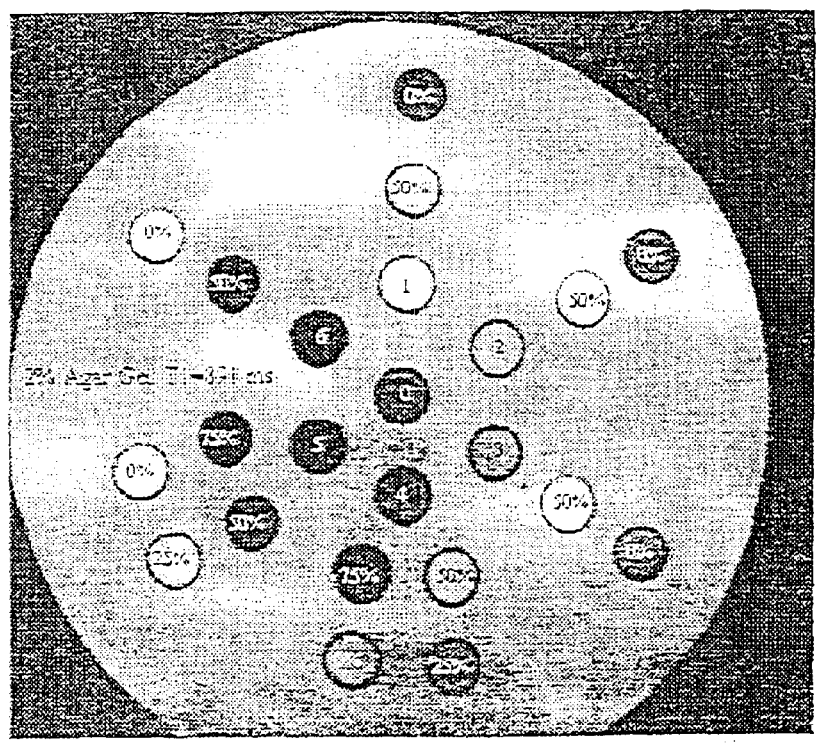
Figure 8:
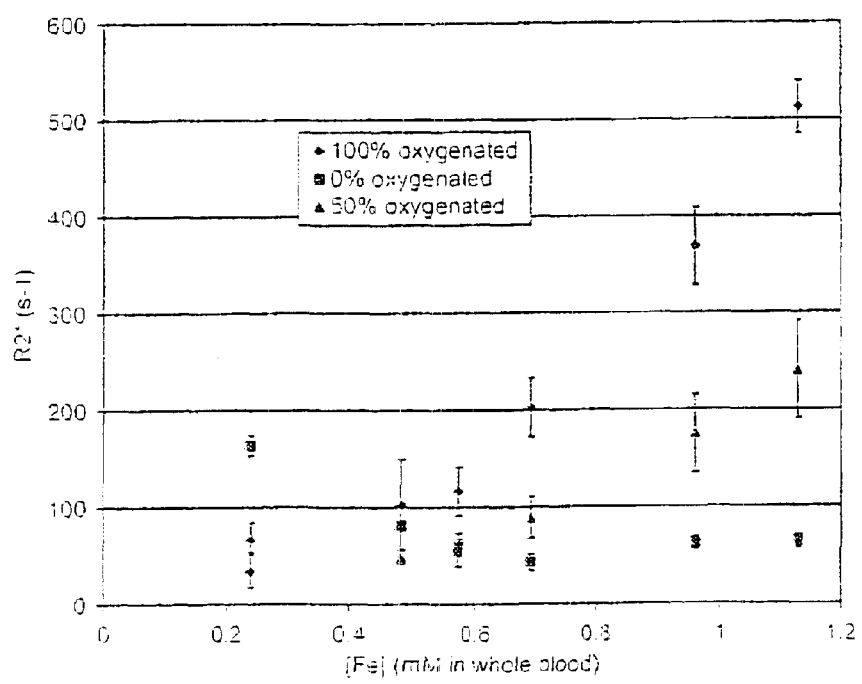
Figure 9:
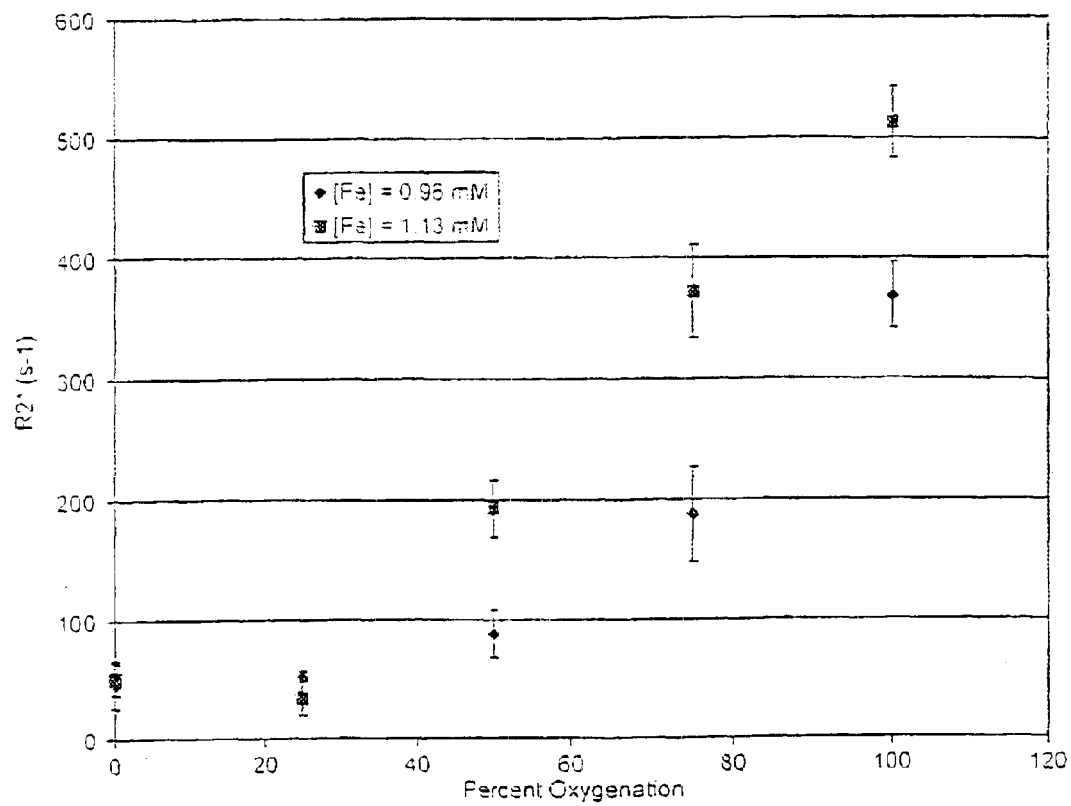
Figure 10:
Figure 11:
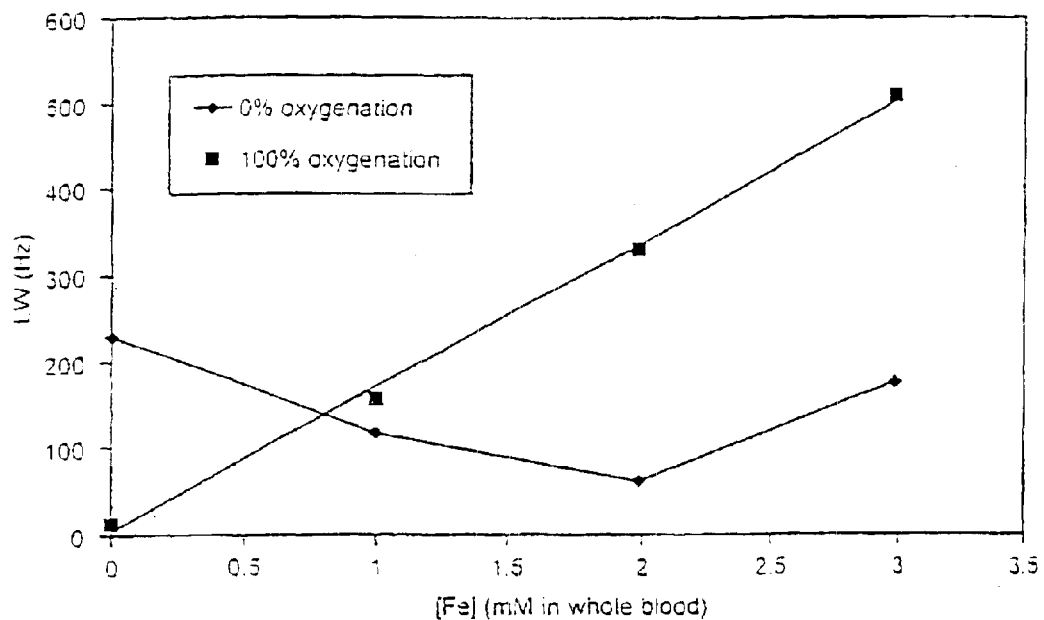
Figure 12:
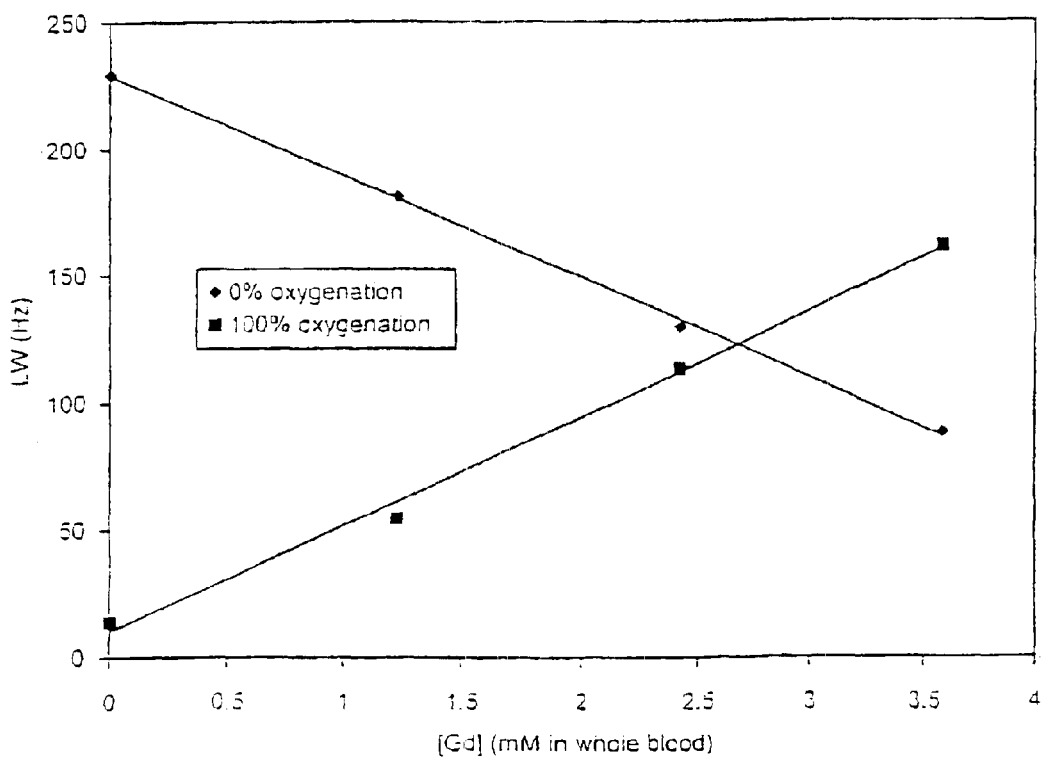
Figure 13:
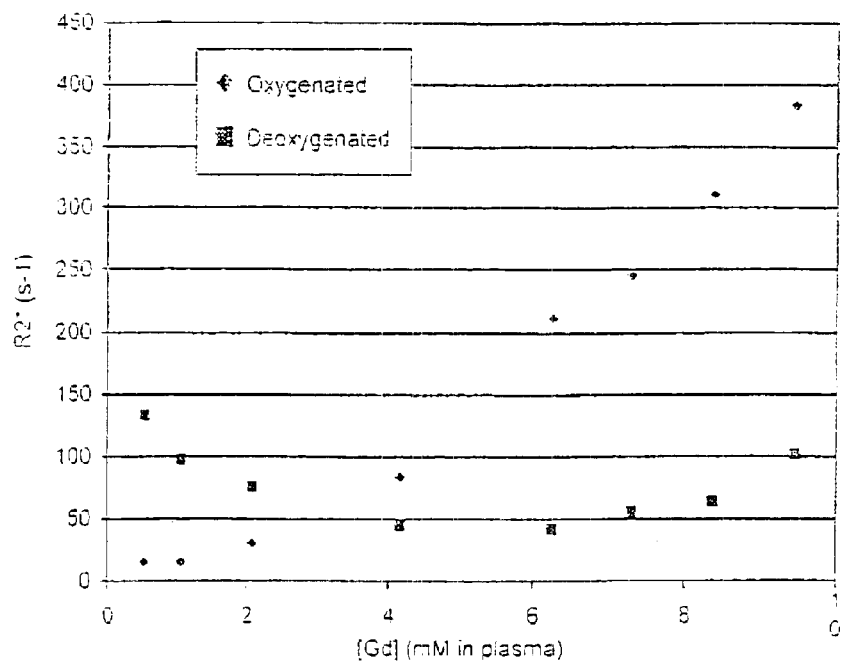
Figure 14:
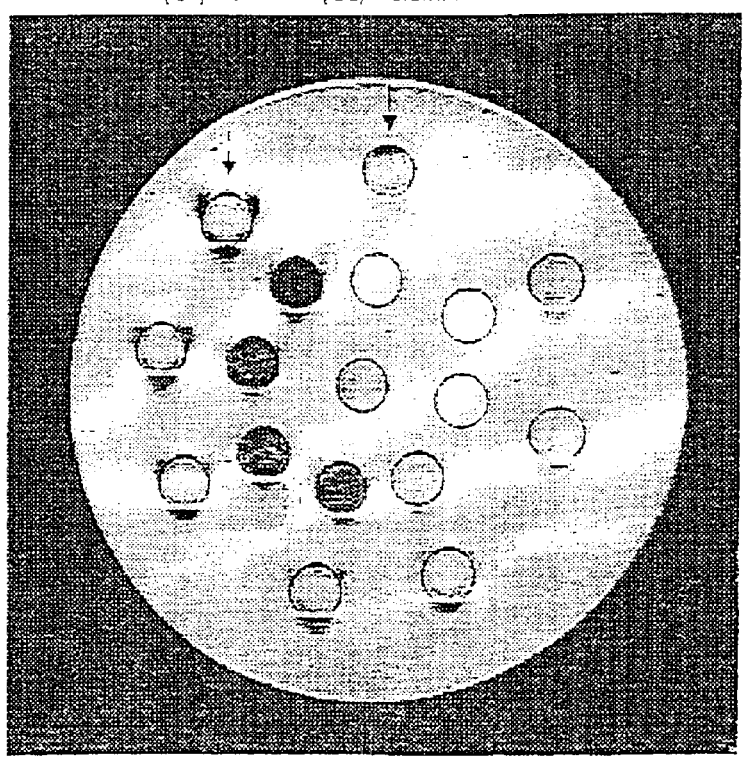
Figure 15:
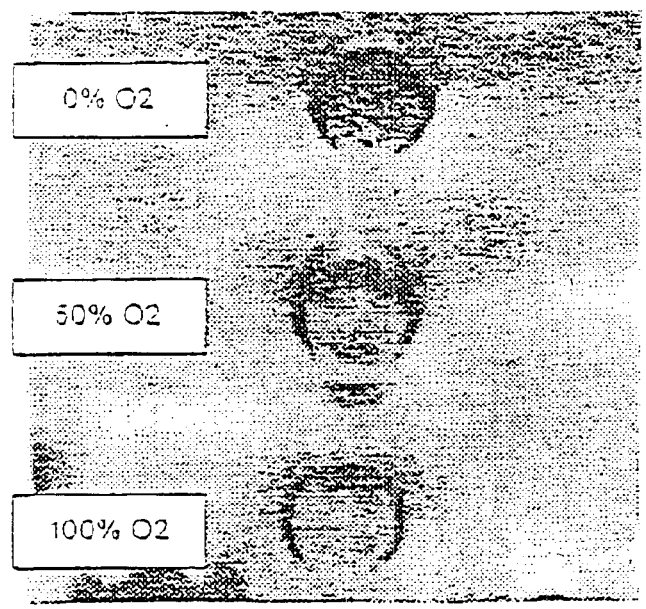
Figure 16:
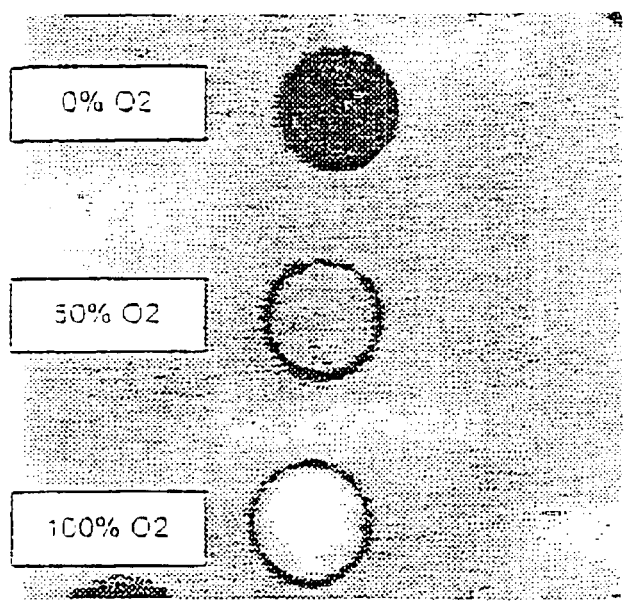

FIG. 5 is a phantom image showing effect of oxygenation on blood signal with a 0.5 mM Fe dose of the contrast agent of Example 1 (Sample 1 contains fully deoxygenated blood with a hematocrit of 53%, Sample 2 contains fully oxygenated blood with the same hematocrit, Sample 3 contains fully deoxygenated blood with hematocrit of 23%, Sample 4 contains fully oxygenated blood with hematocrit 23% and Sample 5 contains plasma (zero hematocrit): Image sequence: 3D gradient echo, TR=10 ms, TE=6 ms, flip=40 deg);

FIG. 6 is a difference image obtained by subtracting the first echo image (TE=1.7 ms) from the second echo image (TE=6 ms FIG. 5);

FIG. 7 is an MR image of a phantom containing blood samples—sample 0 is a control blood sample, samples 1 to 6 (the inner ring) are fully oxygenated blood containing the SPIO agent of Example 1 at 0.24, 0.48, 0.57, 0.69, 0.96 and 0.13 mM Fe, similar Fe concentrations but at 0%, 25%, 50% and 75% oxygenation appear in the outer and middle rings;

FIG. 8 is a graph showing the correlation between Fe concentration and $R2^*$ as a function of blood oxygenation (□ fully oxygenated, >50% oxygenated, □ deoxygenated);

FIG. 9 is a graph showing the correlation between $R2^*$ and blood oxygenation as a function of Fe concentration;

FIG. 10 is an MR image of the abdominal region of a pig;

FIG. 11 is a graph showing NMR linewidth as a function of Fe concentration in oxygenated (□) and deoxygenated (□) blood;

FIG. 12 is a graph showing NMR linewidth as a function of gadolinium concentration in oxygenated (□) and deoxygenated (□) blood;

FIG. 13 is a graph showing the correlation between $R2^*$ of human blood against Gd concentration as a function of blood oxygenation (□ oxygenated, □ deoxygenated);

FIG. 14 is an MR image of a phantom containing oxygenated (inner circle) and deoxygenated blood at Gd concentrations of from 0.5 to 9.4 mM (increasing in the clockwise direction); and FIGS. 15 and 16 are spoiled and non-spoiled gradient echo images of oxygenated, partially oxygenated and deoxygenated blood in a phantom.

EXAMPLE 1

Contrast Agent

An aqueous suspension of a PEGylated superparamagnetic particulate contrast agent was produced essentially as described in the Example 12 of WO97/25073. The properties of the contrast agent were as follows: [Fe]=30.2 mg Fe/mL; density 1.0589 g/mL; $r_1$=19.3 s$^{-1}$ mM$^{-1}$; $r_2$=31.2 s$^{-1}$ mM$^{-1}$; $r_2/r_1$=1.61 (at 20 MHz and 37EC); saturation magentization (Msat)=84 emu/g Fe.

EXAMPLE 2

Figure 1:
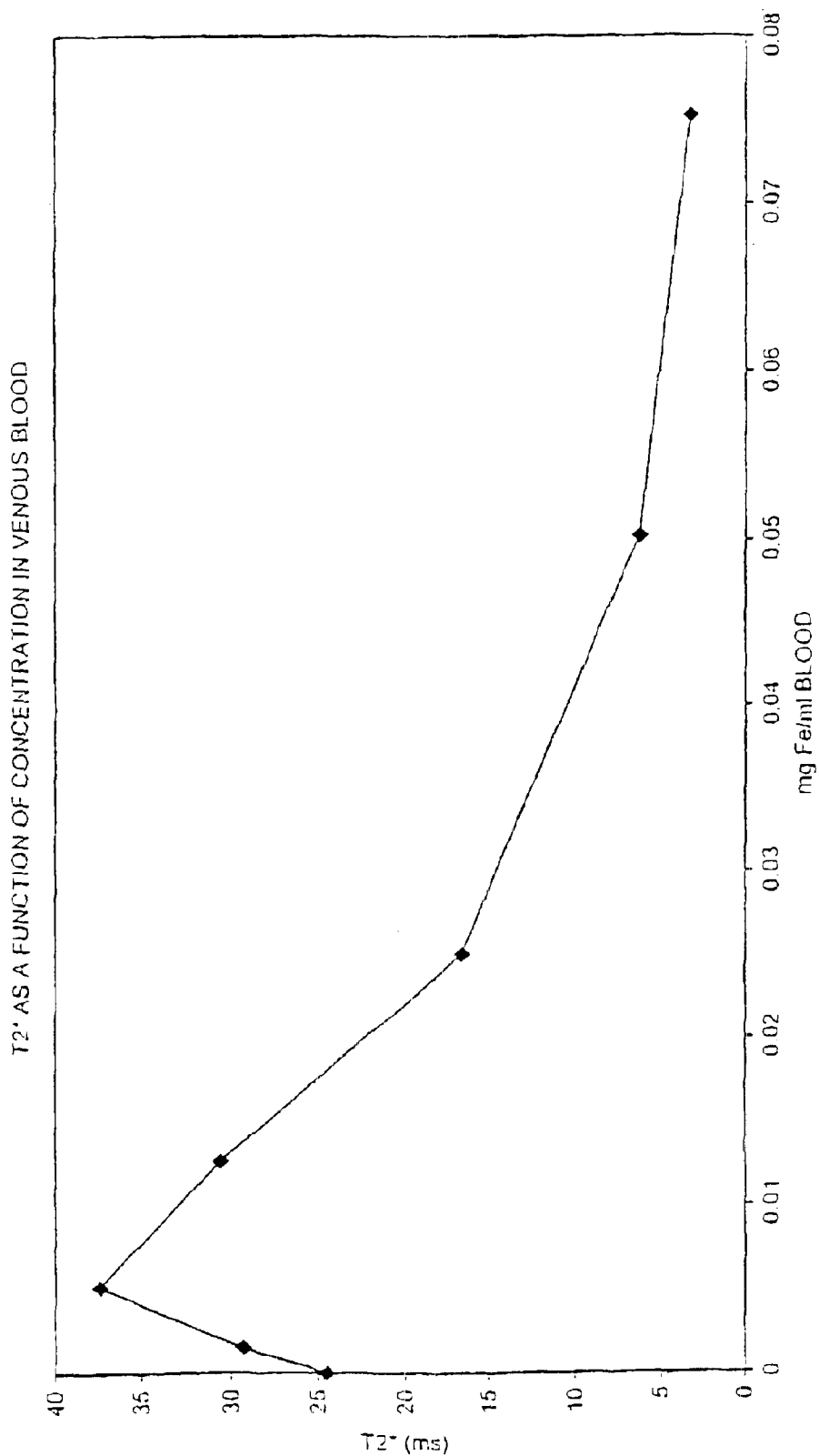
FIG. 1 is a plot of $T_2^*$ (for water protons) as a function of contrast agent concentration in venous blood.

Effect of Contrast Agent Concentration $T_2^*$ was determined in a field of 1.5T for samples of pig venous blood containing various concentrations of the contrast agent of Example 1. As may be seen from FIG. 1, $T_2^*$ initially increases and subsequently decreases as the contrast agent concentration is increased. Maximum $T_2^*$ values occur in the concentration range 2 to 10 μg Fe/mL.

EXAMPLE 3

Imaging

A dose of 4 mgFe/kg of the contrast agent of Example 1 was administered iv to a 80 kg healthy human volunteer.

Figure 2:
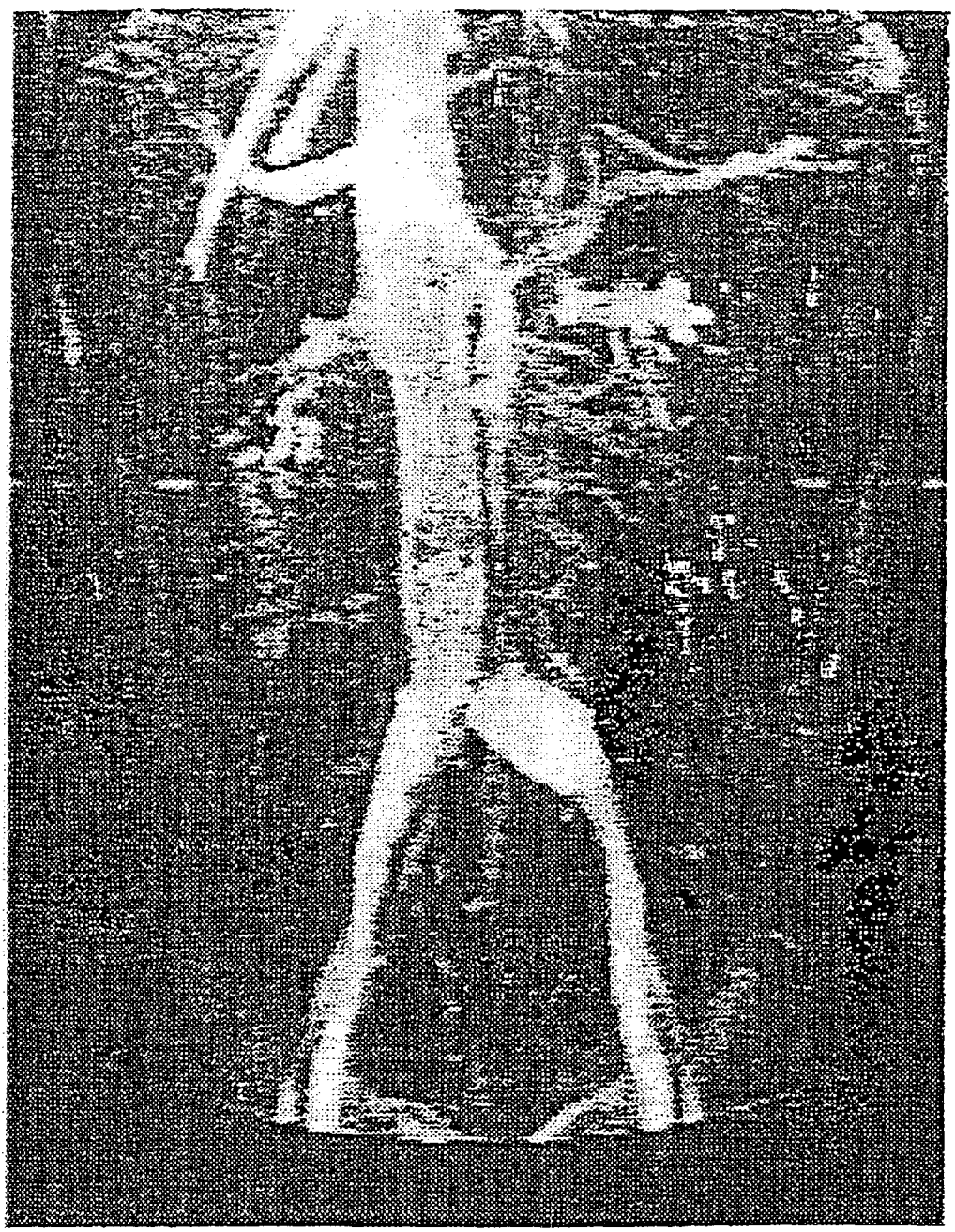
FIG. 2 is a magnetic resonance image of the human groin produced using a method according to the invention.

30 minutes after contrast agent administration the groin area of the volunteer was imaged in a Philips Gyroscan NT 1.5T MR apparatus using a $T_1$-FFE imaging sequence with RT=10 ms and TE=4 ms. The vena cava and iliac veins were clearly visualisable whereas the arterial vessel tree had a much lower signal intensity (see FIG. 2).

EXAMPLE 4

Figure 3:
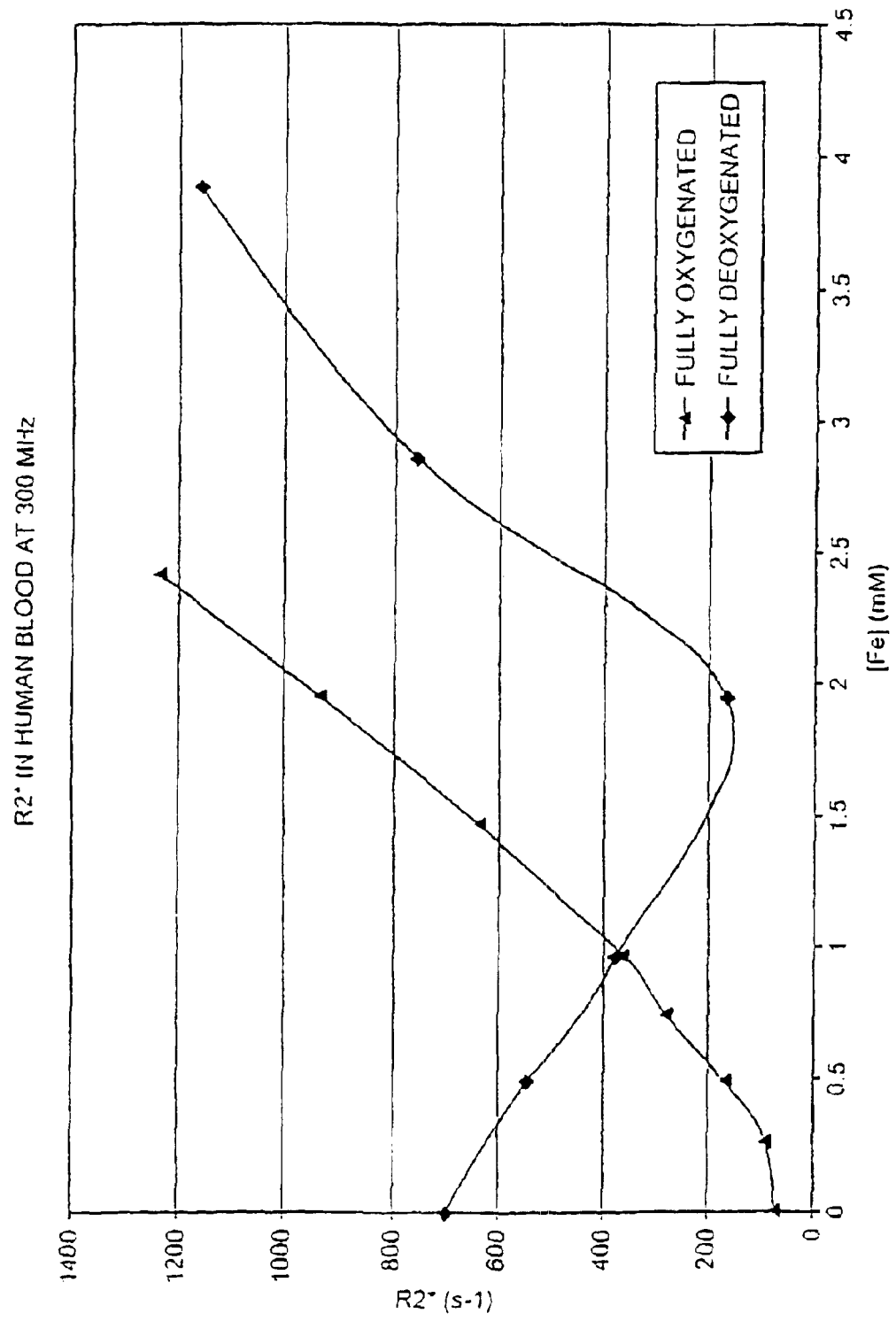
FIG. 3 is a plot of $R2^*$ (ie. $1/T_2^*$) values against iron concentration obtained at 300 MHz in fully oxygenated (>) and fully deoxygenated (□) blood.

Effect of Iron Concentration $R2^*$ relaxivity (in s$^{-1}$) was determined at 300 MHz (7T) using the contrast agent of Example 1 in fully oxygenated and fully deoxygenated human blood. The results are plotted in FIG. 3. In oxygenated blood, $R2^*$ increases constantly with increasing iron concentration. In deoxygenated blood on the other hand $R2^*$ initially decreases with increasing iron concentration, reaching a minimum at about 2 mMFe, whereafter it begins to increase. At all iron concentrations above 1 mMFe, $R2^*$ is higher for oxygenated blood than for deoxygenated blood.

EXAMPLE 5

Effect of Contrast Agent on Fully Oxygenated and Fully Deoxygenated Blood

The effect of the contrast agent of Example 1 on oxygenated and deoxygenated whole human blood was investigated in a phantom model at 1.5 Tesla (Philips NT, Philips Medical Systems, The Netherlands). Human whole blood was obtained from a blood bank (Oslo, Norway). All blood contained 5000 IU of sodium heparin (equivalent to 1.35 ml heparin/450 ml blood) as the anti-coagulant. All blood was obtained fresh from the blood bank and stored at 4EC prior to use. All samples were analysed within 72 hours after blood collection.

Blood deoxygenation was achieved by adding sodium dithionite to the blood sample immediately prior to imaging (the exact degree of deoxygenation however was not determined for this Example). Fully oxygenated blood was obtained by gently bubbling oxygen through the sample.

A double echo 3D gradient echo sequence was used to calculate the $R2^*$ relaxation rate of the blood samples. The sequence parameters were as follows: TR=13 ms, flip=40 degrees, $TE_1$=1.7 ms, $TE_2$=10 ms, slice thickness=2 mm, matrix=256*256, field of view=250 mm.

$R2^*$ relaxation rates was calculated from the signal intensity difference between the images obtained at the first and the second echo. Assuming a monoexponential decay of the signal intensity as a function of $R2^*$ relaxation rate, $R2^*$ can be expressed as follows:

$$R2^* \; (s^{-1}) = \ln(SI_1/SI_2)/(TE_2 - TE_1)$$

where
SI$_1$=Signal intensity at first echo (TE$_1$=1.7 ms)
SI$_2$=Signal intensity at second echo (TE$_1$=10 ms)

Figure 4:
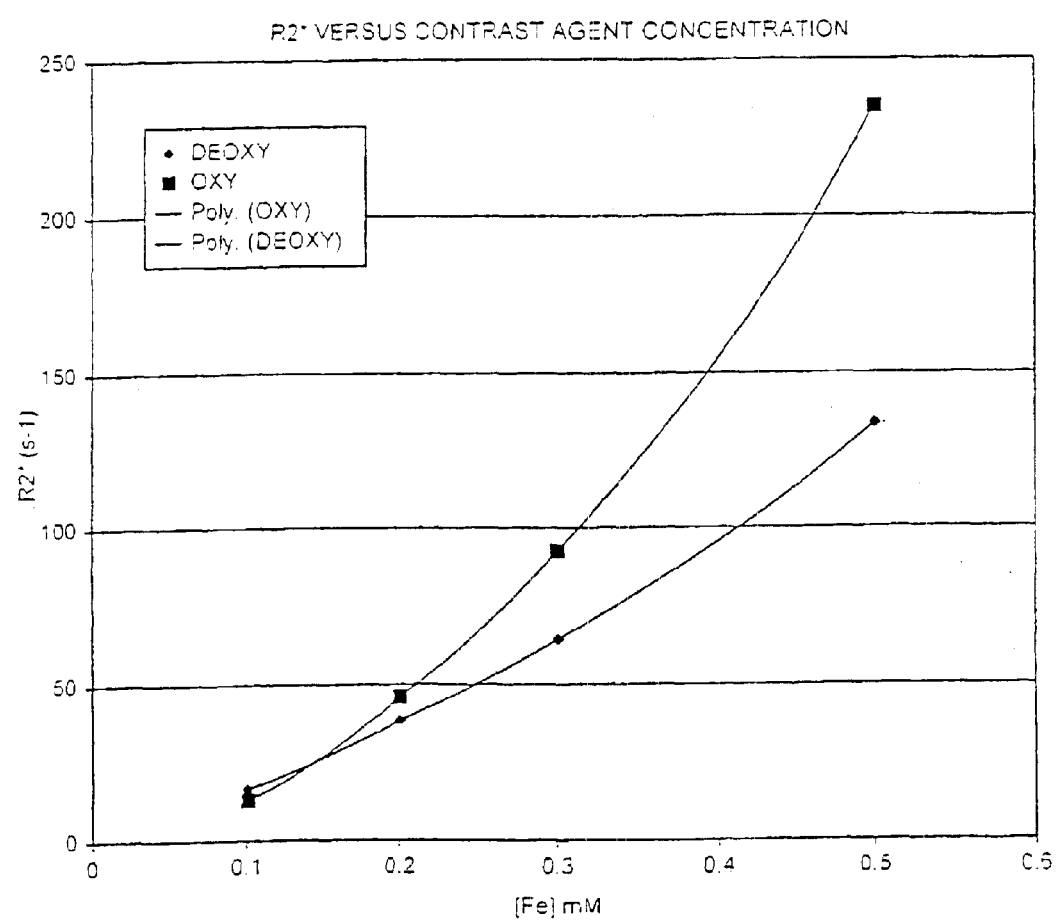
FIG. 4 shows a plot of R2 relaxation rate of oxygenated and deoxygenated whole human blood as function of contrast agent concentration at 1.5 Tesla ($R2^*$ calculated using a double echo gradient echo sequence with TE1=1.7 ms and TE2=10 ms)

FIG. 4 shows the variation in R2* as a function of contrast agent concentration for fully oxygenated and deoxygenated blood. At the lowest concentration investigated (0.1 mM Fe), deoxygenated blood has slightly larger R2* than oxygenated blood. At higher concentrations, the R2* of oxygenated blood increased more rapidly than for deoxygenated blood. At the highest contrast agent concentration investigated (0.5 mM Fe) the difference in R2* between oxygenated and deoxygenated blood was found to be approximately 100 s$^{-1}$. This difference could easily be observed in the image as seen in FIG. 5. The dramatic effect of changing the blood hematocrit was also notable. Sample 1 and sample 3 are both deoxygenated with the same contrast agent concentration. However sample 1 has a hematocrit of 53% and sample 3 has hematocrit of 23%. By subtracting the first echo from the second echo image the resulting subtraction image (FIG. 6) shows more signal from the oxyogenated blood than from the deoxygenated blood because of a larger signal drop from the first to the second echo in the oxygenated blood.

EXAMPLE 6

Effect of Contrast Agent Concentration and Percent Blood Oxygenation on the R2* of Whole Human Blood In this study, the effect of oxygenation on the observed MR signal intensity at 1.5T for whole human blood containing the contrast agent of Example 1 was investigated. A static ex vivo phantom was prepared containing whole blood spiked with the contrast agent of Example 1 over a concentration range of 0 to 1.13 mM Fe. The samples were either oxygenated or deoxygenated (by dithionite), giving oxygenation levels of 0, 25, 50, 75 and 100%. The resulting R2* values obtained as function of the concentration of and oxygenation are reported. The blood was fully oxygenated by gently exposing it to bubbling oxygen for several minutes. De-oxygenation was achieved by addition of dithionite to the blood samples. The percent oxygenation, hemoglobin concentration, and percent hematocrit of all samples were measured using an automatic blood pH/gas analyser (AVL 995). Plasma samples were analysed for concentrations of total iron (Fe) by Inductively Coupled Plasma Atomic Emission Spectrophotometry (ICP-AES).

All imaging was performed at 1.5 T (Philips Gyroscan ACS-NT) using a 3D-FFE shifted echo sequences. A shifted echo sequence was used with a total of 10 echoes generated. The echoes were shifted in steps of 1 ms with the first TE at 3 ms and the last TE at 13 ms. Regions of interests (ROI's) were defined for each sample in each imaging series. The mean signal intensity (SI) and the standard deviation of the mean intensity were recorded. Parametric R2* maps were generated on a pixel-by-pixel basis from the shifted echo images after image smoothing (to redue noise). R2* was fitted from the data set using the expression SI=A exp(−R2*TE); where A is a constant and TE is the echo time. A standard 3D-FFE sequence (TR/TE/flip=13.9 ms/3.1 ms/35E) was also used.

FIG. 7 shows an MR image of the static phantom. The image was acquired using a 3D-FFE sequence. The effect of blood oxygenation on signal enhancement is clearly evident. Notice that at low contrast agent concentrations the signal intensity (SI) is higher in oxygenated compared to deoxygenated blood whereas at high contrast agent concentrations the situation is reversed (SI is higher in deoxygenated blood). FIG. 8 shows the correlation between R2* and contrast agent concentration as a function of blood oxygenation confirming the effect seen in the MR image of FIG. 7. At contrast agent concentrations of below about 0.5 mM Fe, R2* is higher in deoxygenated blood compared to oxygenated blood. At higher contrast agent concentrations (e.g. above approx. 0.8 mM Fe) R2* is higher in oxygenated blood than in deoxygenated blood. In the intermediate concentration range the relationship between R2* and oxygenation is not well defined and arteries and veins are expected to exhibit similar R2* values.

FIG. 9 shows the correlation between R2* and blood oxygenation as a function of contrast agent concentration. At clinically relevant oxygenation levels (above 50%), a nearly linear correlation between R2* and oxygenation level exists at both the lower and higher contrast agent concentration levels.

EXAMPLE 7

MR Angiography in a Pig Model

The purpose of this study was to investigate whether the difference in transverse relaxation, R2*, between arteries and veins could be observed in a pig model after administration of a clinical dose of the contrast agent of Example 1. The contrast agent, at a dose of 4 mg Fe/kg, was injected in the ear vein of a healthy pig. Imaging was performed immediately after injection using a 3D gradient echo sequence (3D FFE; TR/TE/flip=36 ms/20 ms/20E, slice thickness=1 mm; Field of View=310*310 mm). All images were flow compensated ensuring that no flow-dependent contribution to the differences in artery/vein signal intensity occurred. FIG. 10 shows the MR image acquired.

The signal intensity of the vena cava (solid arrow) is higher than in the aorta (dotted arrow).

It is important to notice that the hematocrit in the pig is much lower than in humans (typically 25–30% versus 40–50% in humans). Consequently, the artery-vein R2* difference after administration of the contrast agent of Example 1 is expected to be much smaller in a pig model compared to in humans. The hematocrit dependence of the artery-vein R2* difference is due to the fact that the R2* in fully oxygenated blood increases with increasing hematocrit. This is caused by the larger concentration of red blood cells at high hematocrit, and higher plasma concentration of contrast agent.

Consequently, the difference in SI between arteries and veins would be expected to be more pronounced in humans (as can be seen from Example 3 above).

EXAMPLE 8

Comparison of the R2* of Blood Containing a SPIO Contrast Agent and a Gadolinium Chelate Contrast Agent The purpose of this study was to compare the effect of blood oxygenation on R2* in whole human blood containing a SPIO contrast agent or a chelated paramagnetic metal ion contrast agent. Since the study was done in vitro, extravasation of the chelated ion contrast agent was not at issue and the ECF agent Gd DTPA was used. Since GdDTPA has a much lower magnetic moment than a SPIO, it was expected that the equalization of intra- and extracellular magnetisation in deoxygenated blood would occur at a much higher concentration of GdDTPA compared to the SPIO contrast agent of Example 1.

Fresh whole human blood having a hematocrit of 44% was drawn in to seven identical sample tubes. Three of the samples were spiked with the contrast agent of Example 1 so that the concentration of contrast agent added ranged from 1.00 to 2.99 mM Fe. Three of the samples were spiked with GdDTPA so that the concentration of gadolinium ranged from 1.22 to 3.58 mM Gd and one blank sample was prepared. The percent oxygenation, hemoglobin concentration, and percent hematocrit of all samples were measured using an automatic blood pH/gas analyser (AVL 995). Plasma samples were analysed for concentrations of total iron (Fe) by Inductively Coupled Plasma Atomic Emission Spectrophotometry (ICP-AES).

The samples were prepared so that the longitudinal relaxation rates (R1) at 300 MHz would be equivalent for samples 1 and 4, for samples 2 and 5, and for samples 3 and 6, as shown in Table 2 below

TABLE 1

Estimated longitudinal Relaxation rates at 300 MHz (37EC)

| Sample Number | [Fe] (mM) | [Gd] (mM) | Estimated R1 at 300 MHz ($s^{-1}$) |
|---|---|---|---|
| 1 | 1.0013 | 0 | 4.87 |
| 2 | 1.9868 | 0 | 8.67 |
| 3 | 2.9865 | 0 | 12.53 |
| 4 | 0 | 1.2255 | 4.88 |
| 5 | 0 | 2.4190 | 8.66 |
| 6 | 0 | 3.5813 | 12.33 |
| 7 | 0 | 0 | 1 |

The blood samples were either fully oxygenated (by gently bubbling oxygen through the sample for several minutes) or fully de-oxygenated (by addition of dithionite).

NMR spectroscopy was performed at 300 MHz (7.05 T) on a Varian VXR300S spectrometer equipped with a 5 mm 1H-broadband computer-switcheable probe. Blood samples were prepared in 5 mm NMR tubes (Norell 508-UP). The temperature was adjusted to 37EC using an ethyleneol temperature standard. After initial shimming using a spinning $D_2O$ sample, the shim values were left unchanged. Samples were analysed without spinning and with the lock disconnected. Data was acquired as soon as the frequency of water resonance had ceased to move significantly, a long delay between introduction of the sample into the magnet and the acquisition of the data being undesirable as cell sedimentation could lead to artificial changes in the linewidth.

FIGS. 11 and 12 show the linewidth versus concentration of the contrast agent of Example 1 and GdDTPA respectively in oxygenated and deoxygenated blood. FIG. 11 indicates that at 7.05T the concentration of the contrast agent of Example 1 giving a minimum linewidth in fully deoxygenated blood is approximately 2 mM Fe. From FIG. 12 it is evident that at the highest concentration of GdDTPA investigated (3.58 mM Gd) the concentration giving a minimum linewidth is still not reached.

Compared to the 2 mM Fe minimum linewidth dose for the SPIO agent, a much higher concentration of gadolinium is needed to fully cancel the susceptibility effects in deoxygenated blood. This is because the induced magnetisation of $Gd^{3+}$ is lower than for SPIOs, even at such high field strengths (7.05T). In fact, in the case of gadolinium (or any other paramagnetic compound) the minimum linewidth concentration is independent of field strength because the magnetisation of both the paramagnetic ion and of the paramagnetic deoxyhemoglobin increases linearly with field strength. The magnetic susceptibility of $Gd^{3+}$ is $2.5 \times 10^{-2}$ cgs/mole (=$2.5 \times 10^{-8}$ cgs/($cm^3 \times mM$ Gd)). Given that the magnetic susceptibility of fully deoxygenated blood is $2 \times 10^{-7}$ cgs/$cm^3$, the minimum linewidth concentration of $Gd^{3+}$ is 7.9 mM Gd. Converting this to whole blood concentration ($[Gd]_b = [Gd]_p \cdot (1-Hct)$ where $[Gd]_b$ and $[Gd]_p$ are whole blood and plasma Gd concentrations and Hct is the hematocrit value) it is seen that a Gd concentration of 4.4 mM Gd is needed to cancel the susceptibility effects in fully deoxygenated blood. The minimum linewidth concentration of the SPIO will be field strength dependent because the magnetic moment of the SPIO particle is almost independent of field strength at clinical fields (the particle is essentially magentically saturated at 1T), whereas the magnetisation due to deoxyhemoglobin increases linearly with field. Consequently, the concentration giving a minimum linewidth will increase with field strength.

It can be concluded that a higher concentration of a paramagnetic agent relative to a superparamagnetic agent is needed to get a substantial reduction in R2* in deoxygenated blood. It is important to notice that the oxygenation dependent effect of paramagnetic chelates is field independent. This is due to the fact that the magnetisation of both deoxyhemoglobin and of the paramagnetic ion has a linear field dependence. With superparamagnetic agents the oxygenation effect is strongly field dependent. The lower the field, the lower the minimum linewidth concentration (the concentration where the susceptibility effects in deoxygenated blood are completely eliminated). In order to use the difference in R2* to separate arteries from veins, it is important that the absolute difference in R2* is as large as possible. This requires that the concentration of the magnetically active substance is above the 'matching' concentration. For the contrast agent of Example 1, the required concentration is likely to fall within the clinically tested dose range at relevant field strengths. For gadolinium based substances the required dose is much higher and is may only be achievable at 'first pass' concentrations (where artery/veins separation is not an issue). However, a low concentration of a gadolinium chelate may still be very useful to differentiate arterial from venous blood by increasing the blood signal intensity in T1-weighted images and then making use of the inherent T2 difference between arteries and veins to obtain a differential enhancement as described above.

EXAMPLE 9

Effect of Contrast Agent Concentration and Percent Blood Oxygenation on the R2* of Whole Human Blood In this study, the effect of oxygenation on the observed MR signal intensity at 1.5T for whole human blood containing a gadolinium chelate was investigated. Since the investigation was carried out in vitro and extravasation was thus not of concern, GdDTPA (an ECF rather than a blood pool agent) was used. A static ex vivo phantom was prepared containing whole blood spiked with GdDTPA over a concentration range of 0 to 9.4 mM Gd. The samples were either fully oxygenated (by gentle bubbling of oxygen through the sample for several minutes) or fully deoxygenated (by addition of dithionite). The resulting R2* values obtained as function of GdDTPA concentration and oxygenation were measured. The percent oxygenation, hemoglobin concentration, and percent hematocrit of all samples were measured using an automatic blood pH/gas analyser (AVL 995). Plasma samples were analysed for concentrations of total iron (Fe) by Inductively Coupled Plasma Atomic Emission Spectrophotometry (ICP-AES).

All imaging was performed at 1.5T (Philips Gyroscan ACS-NT) using 3D-FFE shifted echo sequences. A shifted echo sequence was used with a total of 10 echoes generated. The echoes were shifted in steps of 1 ms with the first TE at 3 ms and the last TE at 13 ms. Regions of interests (ROI's) were defined for each sample in each imaging series. The mean signal intensity (SI) and the standard deviation of the mean intensity were recorded. Parametric R2* maps were generated on a pixel-by-pixel basis from the shifted echo images after image smoothing (to reduce noise). R2* was fitted from the data set using the expression SI=Aexp(−R2*TE); where A is a constant and TE is the echo time.

FIG. 13 shows the curve of R2* versus Gd concentration in oxygenated and deoxygenated blood. The effect of blood oxygenation on R2* is clearly seen. In fully oxygenated blood, an almost linear relationship exists between R2* and Gd concentration. In deoxygenated blood, on the other hand, an initial decrease in R2* occurs with increasing Gd concentration. A minimum R2* is reached at a gadolinium concentration of about 6–7 mM. The shape of the curve is similar to that seen for SPIO contrast agents, only that the minimum R2* occurs at a much higher contrast agent concentration.

FIG. 14 shows an image of the phantom (2D-FFE, TR=100 ms, TE=8 ms, flip=30 degrees). The inner circle contains oxygenated blood samples and the outer circle oxygenated samples. Notice that, at low Gd concentrations, a clear difference in signal intensity is observed between oxygenated and deoxygenated blood, with oxygenated blood giving a higher signal intensity. At the higher concentrations the situation is reversed with deoxygenated blood giving a higher signal intensity. The low concentration effect could be an attractive way to separate arteries from veins in gadolinium enhanced MRI.

EXAMPLE 10

Sub-matched Susceptibility Contrast Agent Concentration Combined with Non-spoiled Gradient Echo Imaging Into a phantom were placed three vials containing whole human blood spiked with 0.25 mM Fe of the contrast agent of Example 1. In one vial the blood was fully oxygenated, in a second 50% oxygenated and in the third fully deoxygenated.

The contrast agent concentration corresponded to a 1 mg Fe/kg bodyweight dosage in humans.

The phantom was imaged using a 1.5 Tesla Philips Gyroscan ACS/NT magnetic resonance imager. In collecting the image of FIG. 15, a spoiled FFE sequence was used (TR=100 ms/TE=8 ms/flip=20E). In collecting the image of FIG. 16, a non-spoiled FFE sequence was used (TR=14 ms/TE=8.8 ms/flip=35E). In the spoiled image the signal intensity for all three blood samples is essentially equal. In the non-spoiled image there is a large signal intensity difference between the oxygenated and deoxygenated blood.

What is claimed is:

1. A method of magnetic resonance imaging of regional blood oxygenation which comprises administering into the vasculature of a vascularised human or non-human animal subject a $T_2$ blood pool contrast agent, detecting a magnetic resonance signal from at least part of the vasculature of said subject into which said contrast agent distributes, and manipulating said signal to generate an indication of the partial pressure of oxygen ($pO_2$) in at least part of said vasculature wherein $R_1$ of blood in an artery is determined and hematocrit is determined therefrom.

2. The method of claim 1 wherein hematocrit and R2* of blood in a vein are determined and $pO_2$ in said vein is determined therefrom.

3. The method of claim 1 wherein said indication is an image indicative of $pO_2$.

4. The method of claim 3 wherein said contrast agent is administered in a quantity such that R2 of venous blood is greater than R2 of arterial blood.

5. The method of claim 4 wherein a non-spoiled gradient echo sequence is used to generate a magnetic resonance image.

6. The method of claim 5 wherein a spoiled gradient echo sequence is used to generate a further magnetic resonance image and the images from the spoiled and non-spoiled gradient echo sequences are subtracted to produce an image in which the signal difference between arteries and veins is enhanced.

7. The method of claim 1 wherein said contrast agent is administered in a quantity such that R2* of venous blood is less than R2* of arterial blood.

* * * * *